United States Patent
Kobayashi

(10) Patent No.: US 9,064,761 B2
(45) Date of Patent: Jun. 23, 2015

(54) METHOD OF MANUFACTURING SEMICONDUCTOR DEVICE AND METHOD OF TESTING THE SAME

(71) Applicant: NEC Corporation, Minato-ku, Tokyo (JP)

(72) Inventor: Hideaki Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/196,045

(22) Filed: Mar. 4, 2014

(65) Prior Publication Data

US 2014/0248721 A1    Sep. 4, 2014

(30) Foreign Application Priority Data

Mar. 1, 2013   (JP) .................................. 2013-040958

(51) Int. Cl.
 *G01R 31/26* (2014.01)
 *H01L 21/66* (2006.01)
 *G01R 31/02* (2006.01)

(52) U.S. Cl.
 CPC ......... *H01L 22/14* (2013.01); *H01L 2924/0002* (2013.01); *H01L 22/34* (2013.01)

(58) Field of Classification Search
 USPC ................ 257/48, E21.531, E23.002; 438/18
 See application file for complete search history.

(56) References Cited

U.S. PATENT DOCUMENTS

| 2012/0018723 A1* | 1/2012 | Su et al. .......................... 257/48 |
| 2012/0146130 A1* | 6/2012 | Hirler et al. ................... 257/329 |
| 2013/0057312 A1* | 3/2013 | Pagani ...................... 324/762.01 |
| 2013/0277857 A1* | 10/2013 | Yoo .............................. 257/774 |

FOREIGN PATENT DOCUMENTS

JP        2012-174826 A     9/2012

\* cited by examiner

*Primary Examiner* — Khaja Ahmad
(74) *Attorney, Agent, or Firm* — Sughrue Mion, PLLC

(57) ABSTRACT

A method of manufacturing a semiconductor device according to the present invention includes, in a silicon substrate of the semiconductor chip, providing two TSVs (Through-Silicon-Vias) that are formed such that interfaces with the silicon substrate are covered with insulating films and bottom surface sides thereof do not penetrate through the silicon substrate, providing a high concentration impurity region in a peripheral region of the bottom surface sides of the TSVs in the silicon substrate, connecting a test circuit to the TSVs, inputting a test signal from one of the TSVs and detecting the test signal output via the high concentration impurity region and the other TSV, thereby evaluating a failure of the semiconductor chip, thinning a bottom surface of the semiconductor chip and removing the high concentration impurity region.

2 Claims, 7 Drawing Sheets

METHOD OF MANUFACTURING SEMICONDUCTOR DEVICE AND METHOD OF TESTING THE SAME

INCORPORATION BY REFERENCE

This application is based upon and claims the benefit of priority from Japanese patent application No. 2013-040958, filed on Mar. 1, 2013, the disclosure of which is incorporated herein in its entirety by reference.

BACKGROUND OF THE INVENTION

1. Technical Field

The present invention relates to a method of manufacturing a semiconductor device and a method of testing the same.

2. Background Art

In the semiconductor device, TSV (Through-Silicon-Via) technology for providing a through electrode in a circuit board and laminating the circuit board is well known.

In TSV, through electrodes for connection can be arranged at an order interval of μ unit. Moreover, as a connecting distance is shorter than that of the known wire bonding, TSV can create benefits such as being less susceptible to noise, less delay, attenuation, and waveform degradation because of low parasitic capacitance and resistance, and eliminating the need for extra circuits for amplification and electrostatic discharge protection, thereby realizing circuits having a high-speed operation and low power consumption.

For example, Japanese Unexamined Patent Application Publication No. 2012-174826 discloses a semiconductor device including a through electrode that is formed of a continuous conductor extending through two or more substrates.

FIGS. 6A to 7B are diagrams showing a manufacturing process of a semiconductor chip 100.

FIG. 6A is a diagram showing a state in which a transistor 102 and TSVs 110a and 110b are formed in and above the semiconductor chip 100. The TSVs 110a and 110b are formed when the transistor 102 is formed.

Next, as shown in FIG. 6B, a wiring layer 103 and wafer test pads 104 are formed above the semiconductor chip 100. Then, the transistor 102 is tested using the wafer test pads 104. As the TSVs 110a and 110b are buried in a silicon substrate and not connected to a closed circuit, continuity of the TSVs 110a and 110b cannot be tested.

FIG. 7A is a diagram showing a thinned semiconductor chip 100. The semiconductor chip 100 is thinned, and micro bumps 105 are connected to lower surfaces of the TSVs 110a and 110b.

FIG. 7B is a diagram showing a laminated semiconductor chip 100. The semiconductor chip 100 is laminated above another semiconductor chip 107 using micro bumps 105 for connecting it to the semiconductor chip 107, eventually completing a three-dimensional LSI.

As for a semiconductor chip having a non-penetrating TSV (hereinafter referred to as a via-middle style) like the one shown in FIGS. 6A and 6B, since a lower part of the TSV is buried in a silicon substrate 115, the wafer test pads 104 cannot detect a failure.

Moreover, the TSV will penetrate the silicon substrate 115 after thinning processing in a lamination process, however as a pitch between the micro bumps is extremely small and the wafer is extremely thin, it is particularly difficult to conduct a wafer test.

Therefore, when the semiconductor chip 100 including a via-middle TSV is tested, it has been necessary to conduct the test after the semiconductor chip 100 is laminated, using a test circuit or the like for the semiconductor chip 107 that is a laminated layer.

However, the present inventor has found a problem that when a test is conducted after lamination, if at least one TSV has a failure in the laminated chips, the entire laminated semiconductor device including laminated semiconductor chips besides those in which the at least one TSV has a failure will be defective, thereby increasing the manufacturing cost.

SUMMARY

The present invention is made to solve such a problem, and an object of the present invention is to provide a method of manufacturing a semiconductor device and a method of testing the same that detect a failure in a semiconductor chip before lamination.

An exemplary aspect of the present invention is a method of manufacturing a semiconductor chip that includes, in a silicon substrate of the semiconductor chip, providing two TSVs (Through-Silicon-Vias) that are formed such that interfaces with the silicon substrate are covered with insulating films and bottom surface sides thereof do not penetrate through the silicon substrate; providing a high concentration impurity region in a peripheral region of the bottom surface sides of the TSVs in the silicon substrate; connecting a test circuit to the TSVs; inputting a test signal from one of the TSVs and detecting the test signal output via the high concentration impurity region and the other TSV, thereby evaluating a failure of the semiconductor chip; thinning a bottom surface of the semiconductor chip and removing the high concentration impurity region; and laminating a plurality of the thinned semiconductor chips.

Another exemplary aspect of the present invention is a method of testing a semiconductor device that includes, in a silicon substrate of the semiconductor chip, providing two TSVs (Through-Silicon-Vias) that are formed such that interfaces with the silicon substrate are covered with insulating films and bottom surface sides thereof do not penetrate through the silicon substrate; providing a high concentration impurity region in a peripheral region near the bottom surface sides of the TSVs in the silicon substrate; connecting a test circuit to the TSVs; and inputting a test signal from one of the TSVs and detecting the test signal output via the high concentration impurity region and the other TSV, thereby evaluating a failure of the semiconductor chip.

BRIEF DESCRIPTION OF THE DRAWINGS

The above and other aspects, features, and advantages of the present invention will become more apparent from the following description of certain exemplary embodiments when taken in conjunction with the accompanying drawings, in which.

EXEMPLARY EMBODIMENT

Exemplary Embodiment

In a manufacturing process of a semiconductor device, a plurality of semiconductor chips having TSVs formed therein are integrated to form a semiconductor device. This exemplary embodiment makes it possible to test continuity of the TSVs in a state of the semiconductor chip.

Hereinafter, the exemplary embodiment of the present invention shall be explained with reference to the drawings.

Figure 1A:
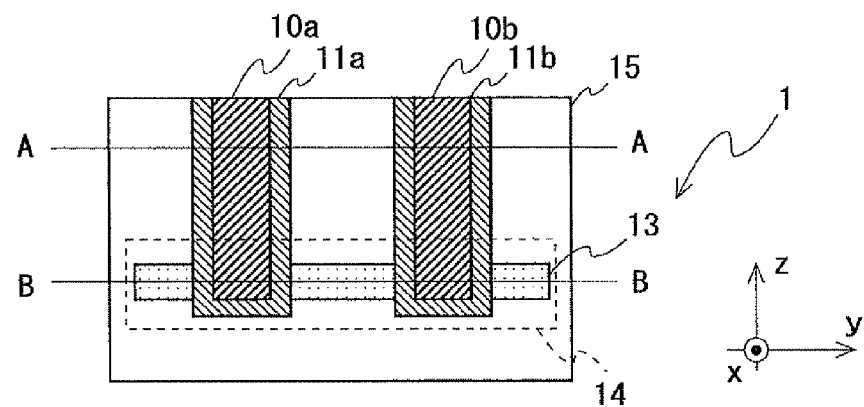
FIGS. 1A to 1C are diagrams showing a semiconductor chip according to an exemplary embodiment.
Figure 1B:
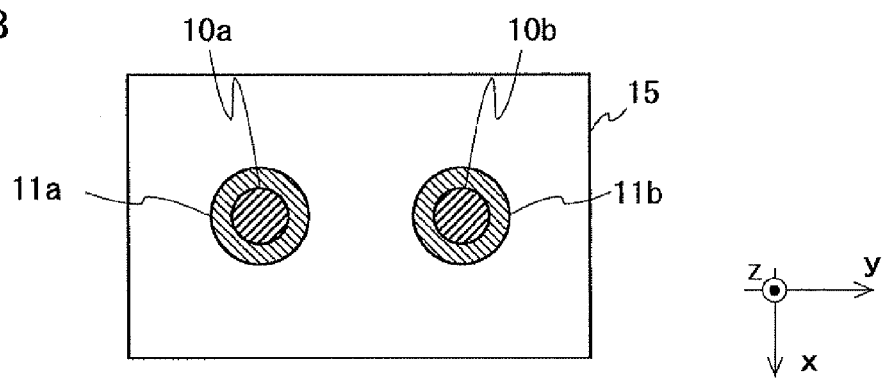
Figure 1C:
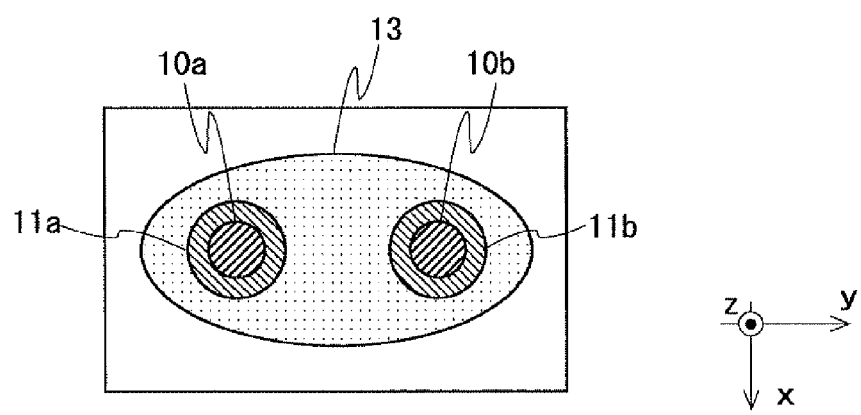

FIGS. 1A to 1C are diagrams showing a semiconductor chip 1 that is being manufactured. FIG. 1A shows a cross-section along a z axis direction of the semiconductor chip 1. Note that in the following explanation of cross-sections, hatching of silicon substrate cross-sections shall be omitted.

In the semiconductor chip 1, a TSV 10a covered with an insulating film 11a, a TSV 10b covered with an insulating film 11b, and a high concentration impurity region 13 are formed in a silicon substrate 15.

FIG. 1B is a diagram showing a cross-section taken along the line A-A of the semiconductor chip 1 shown in FIG. 1A in an xy plane direction. FIG. 1C is a diagram showing a cross-section taken along the line B-B of the semiconductor chip 1 shown in FIG. 1A in the xy plane direction.

The TSVs 10a and 10b are buried in the silicon substrate 15 of the semiconductor chip 1. The insulating films 11a and 11b are provided at interfaces between the TSVs 10a and 10b and the silicon substrate 15, respectively, and cover side and bottom surfaces of the TSVs 10a and 10b, respectively. Note that the insulating films 11a and 11b are desirably thinner than an insulating film of a common TSV. Thus, capacitors C1 and C2, which will be explained later, can be formed.

The high concentration impurity region 13 is formed inside the silicon substrate 15 near the TSVs 10a and 10b and to the side of a bottom surface of the silicon substrate 15 (a lower side in the y axis direction). To be specific, the high concentration impurity region 13 is formed by, for example, a method of depositing an impurity-doped glass layer, etching back the glass layer, performing high-temperature annealing processing, and then performing out-diffusion.

Note that a coupling region 14 is ground at the time of the thinning processing in the lamination process of the semiconductor chip 1. Thus, there is no influence on the normal operation.

Figure 2:
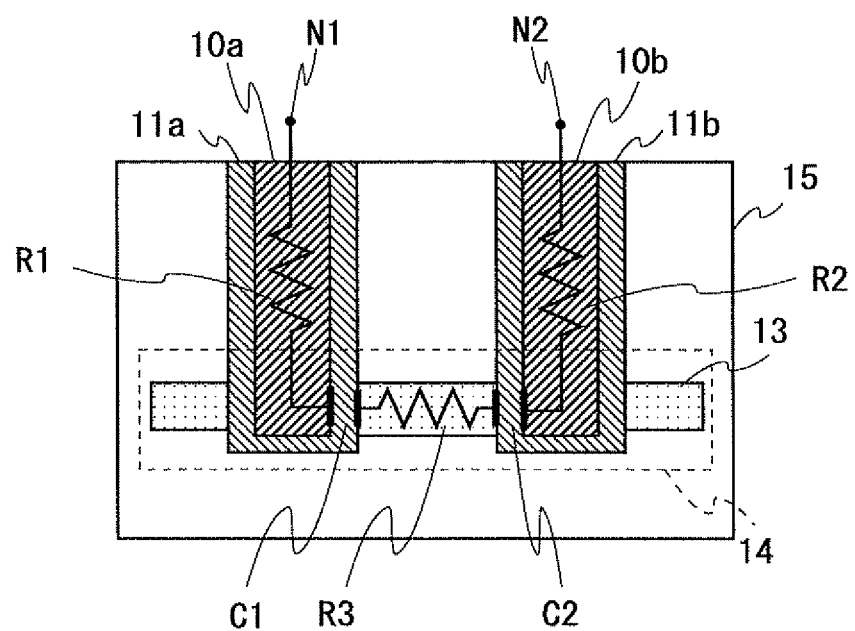
FIG. 2 shows an equivalent circuit of an electrical circuit formed along a yz plane of the semiconductor chip according to the exemplary embodiment.

FIG. 2 is a diagram showing an equivalent circuit of an electrical circuit formed along a yz plane of the semiconductor chip 1.

An equivalent circuit 20 shall be explained below where a resistor of the TSV 10a is a resister R1, a resister of the TSV 10b is a resistor R2, and a resister of the high concentration impurity region 13 between the TSVs 10a and 10b is a resistor R3. A capacitor configured such that a side surface of the TSV 10a faces a side surface of the high concentration impurity region 13 with the insulating film 11a interposed therebetween shall be referred to as the capacitor C1. Further, a capacitor configured such that a side surface of the TSV 10b faces a side surface of the high concentration impurity region 13 with the insulating film 11b interposed therebetween shall be referred to as the capacitor C2.

Specifically, the equivalent circuit 20 includes the resistor R1, one end of which is connected to a node N1, a capacitor C1, one end of which is connected to the other end of the resistor R1, the resistor R3, one end of which is connected to the other end of the capacitor C1, a capacitor C2, one end of which is connected to the other end of the resistor R3, and the resistor R2, one end of which is connected to the other end of the capacitor C2 and the other end of which is connected to a node N2.

By providing the high concentration impurity region 13 in the semiconductor chip 1 according to this exemplary embodiment, it is possible to form the equivalent circuit 20 that connects from the node N1, which is one end of the TSV 10a, to the node N2, which is one end of the TSV 10b. Further, the equivalent circuit 20 can realize electrical coupling between the TSVs 10a and 10b by a low-resistance portion by means of the high concentration impurity region 13.

Next, the case of testing the equivalent circuit 20 shall be explained.

Figure 3:
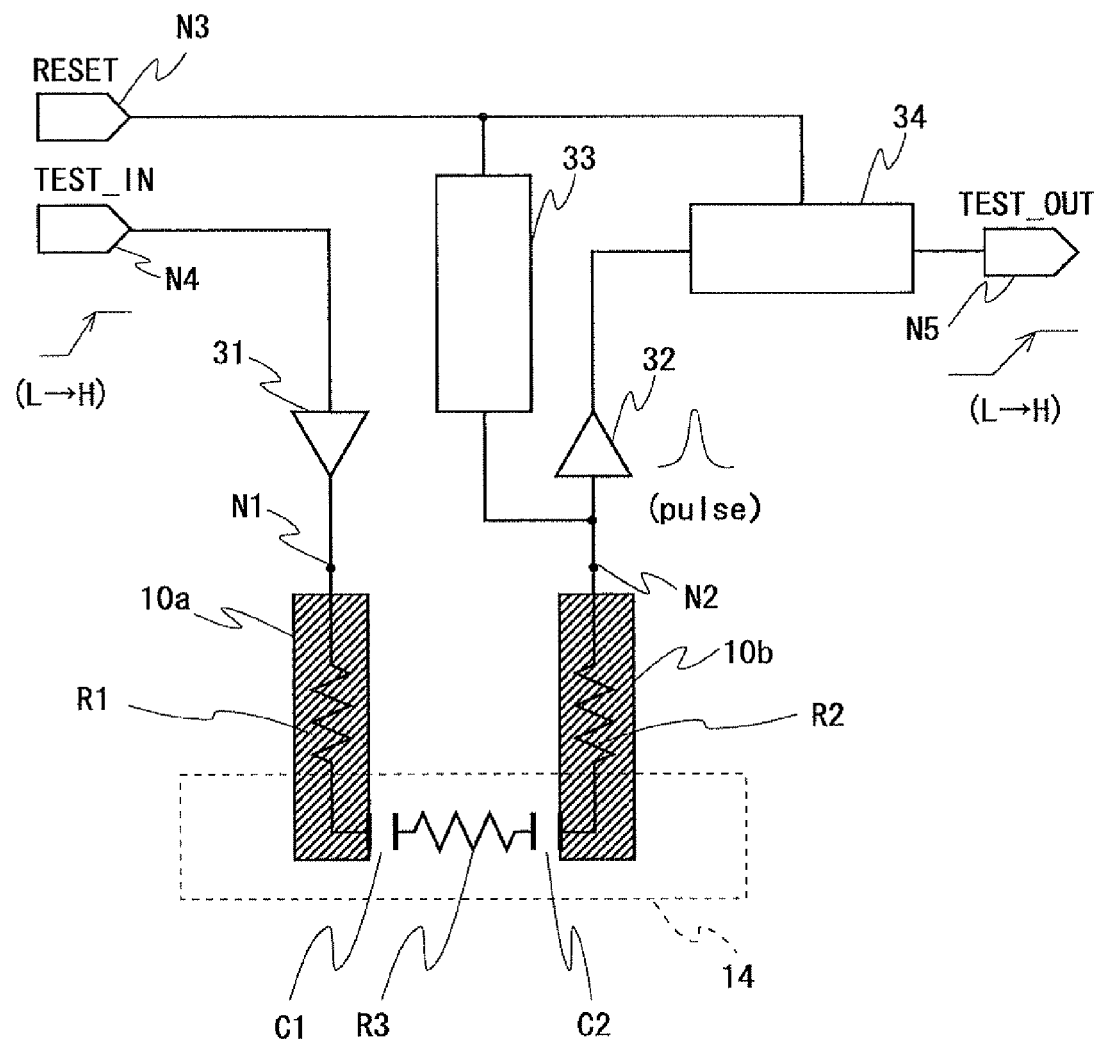
FIG. 3 is a diagram showing a state in which a test circuit is connected to the equivalent circuit.

FIG. 3 is a diagram showing a state in which a test circuit 30 is connected to the equivalent circuit 20.

The test circuit 30 includes buffers 31 and 32, an initialization circuit 33, and an error detection FF (Flip Flop) 34.

As for the buffer 31, an input side is connected to a test signal input terminal N4 for inputting a test signal, and an output side is connected to the node N1 of the equivalent circuit 20.

As for the buffer 32, an input side is connected to the node N2 of the equivalent circuit 20, and an output side is connected to a SET terminal of the error detection FF 34.

As for the initialization circuit 33, one end is connected to the node N2 of the equivalent circuit 20, and the other end is connected to a RESET signal input terminal N3 and a RESET terminal of the error detection FF 34.

As for the error detection FF 34, the SET terminal is connected to the output side of the buffer 32, and the RESET terminal is connected to a RESET signal input terminal N3.

The case in which the TSVs 10a and 10b are normal shall be explained below. First, a RESET signal is input through the RESET signal input terminal N3, and output TEST_OUT of the error detection FF 34 and the node N2 is initialized to the L level.

Next, when a test signal of L→H is applied to the TEST signal input terminal N4, the test signal is propagated to the node N2 as a pulse signal. The pulse signal of the node N2 is input to the SET terminal of the error detection FF 34, the error detection FF 34 is set to H, and the test output terminal N5 transitions from L to H.

That is, when the TSVs 10a and 10b are normal, if a test signal of L→H is applied to the test terminal, the test output terminal N5 transitions from L to H.

Figure 4:
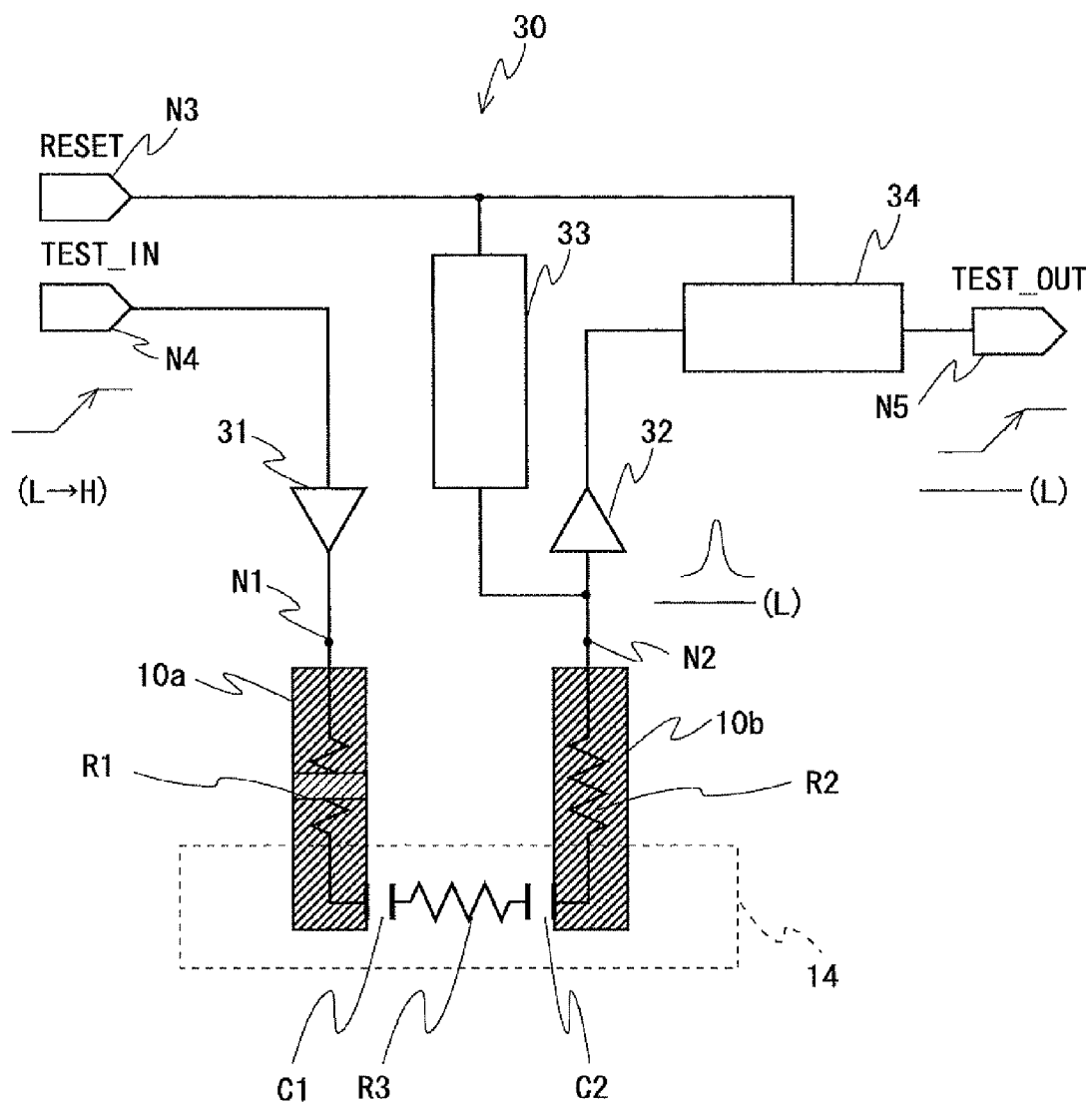
FIG. 4 is a diagram showing a state in which a TSV according to the exemplary embodiment has a failure.

Next, the case in which the TSVs 10a and 10b have a failure shall be explained. FIG. 4 is a diagram showing that the TSV 10a has a failure. First, a RESET signal is input from the RESET signal input terminal N3, and output TEST_OUT of the error detection FF 34 and the node N2 are initialized to the L level. Next, the test signal of L→H is applied to the test signal input terminal N4.

As the TSV 10a has an open failure, the test signal is not propagated to the node N2 and the error detection FF 34 is maintained in an initial state. As a result, the test output terminal N5 is maintained to be at the L level, which is the initial state.

In this exemplary embodiment, the test circuit 30 is connected to the TSVs 10a and 10b, a test signal is input thereto, and an output therefrom is examined, thereby enabling detection of a failure in the TSVs 10a and 10B in the state of the semiconductor chip prior to lamination and thus controlling the manufacturing cost.

Figure 5A:
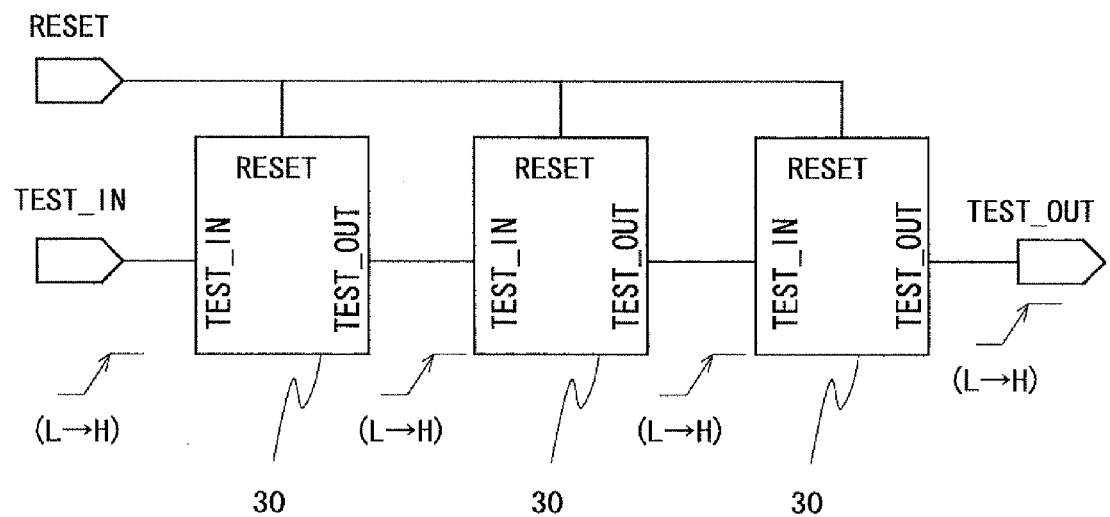
FIGS. 5A and 5B are diagrams showing a test chain according to the exemplary embodiment.
Figure 5B:
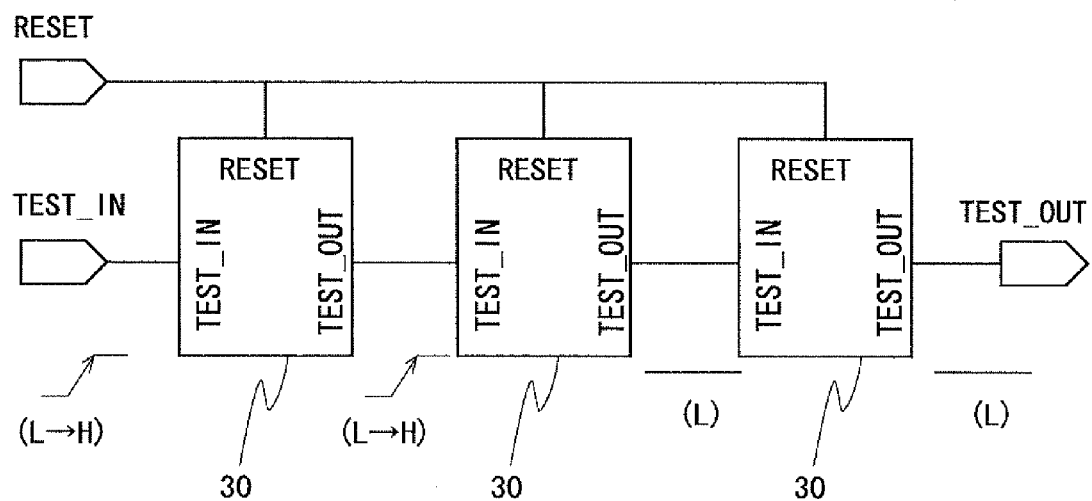
Figure 6A:
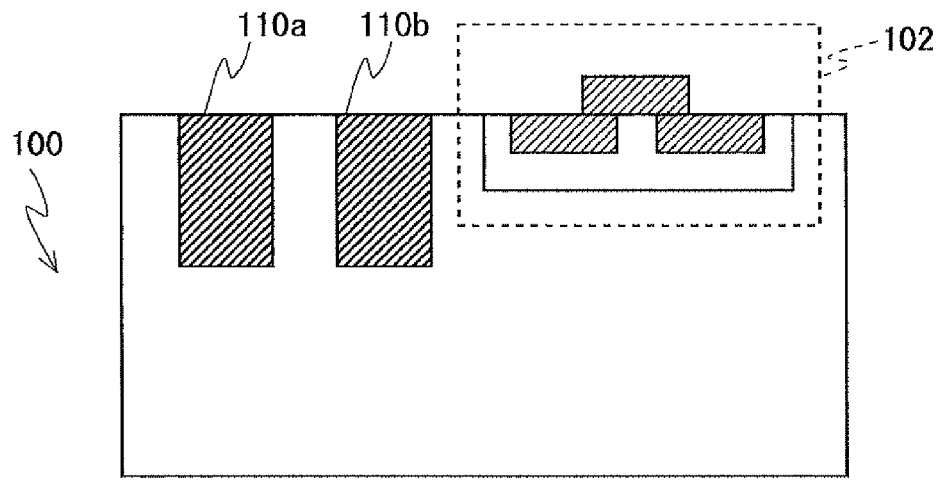
FIGS. 6A and 6B are diagrams showing a manufacturing process of a common semiconductor chip.
Figure 6B:
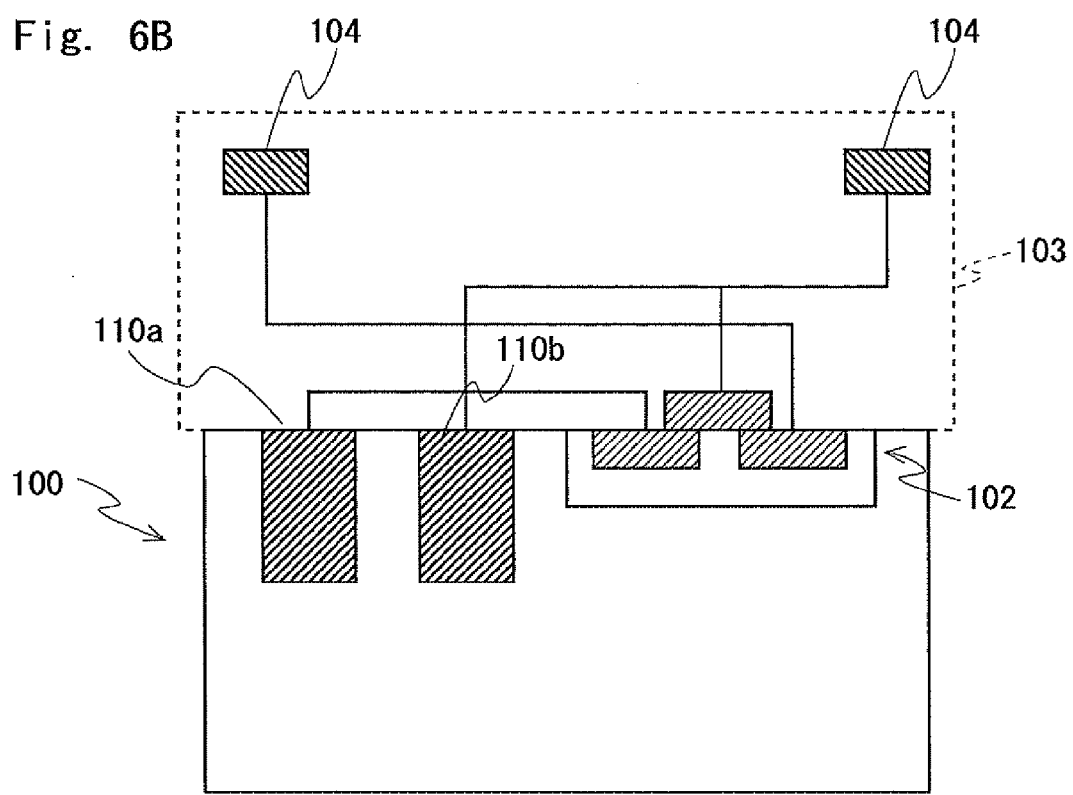
Figure 7A:
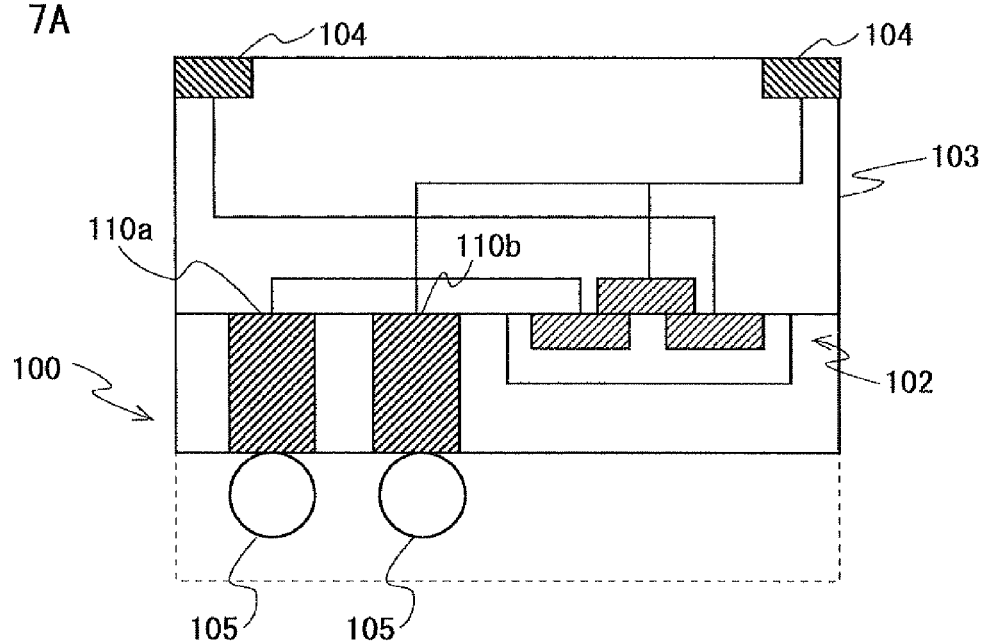
FIGS. 7A and 7B are diagrams showing a manufacturing process of a common semiconductor chip.
Figure 7B:
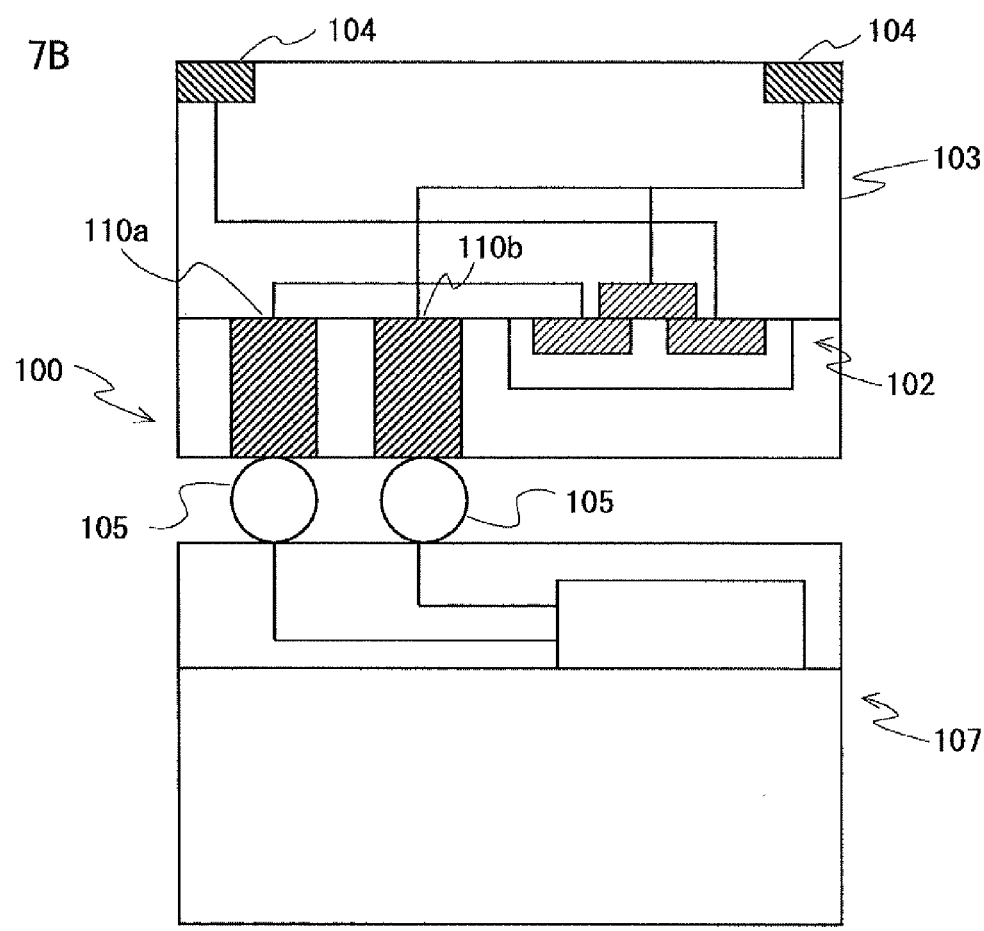

Moreover, a plurality of the test circuits 30 may be connected and used as a test chain 35. FIGS. 5A and 5B are diagrams showing the test chain 35. FIG. 5A shows the case in which TSVs are normal, whereas FIG. 5B shows the case in which the TSVs are abnormal.

When a plurality of the test circuits 30 are connected to form the test chain 35, the test circuits 30 are connected to the respective equivalent circuits 20. Then, the test output terminal N5 of the error detection FF 34 of the preceding test circuit 30 is connected to the test signal input terminal N4 of the subsequent test circuit 30. When the connected equivalent circuits 20 are normal, the test circuits 30 output signals having waveforms which are the same as the waveforms of the test input signal. It is therefore possible to connect the test circuits 30 to multiple circuits to conduct a test, and when a TSV of the equivalent circuit 20 is abnormal, the output signal is not normally output as shown in FIG. 5B, thereby enabling detection of the abnormality.

According to the method of inspecting the semiconductor device of this exemplary embodiment, the use of the test chain enables a test to be conducted collectively on a plurality of pair TSVs formed in the semiconductor chip before lamination.

Note that the present invention is not limited by the above exemplary embodiment and various modifications can be made within the scope of the present invention.

According to the present invention, it is possible to provide a semiconductor device capable of detecting a manufacturing failure during a manufacturing process of a semiconductor chip prior to lamination of a semiconductor chip.

While the invention has been particularly shown and described with reference to exemplary embodiments thereof, the invention is not limited to these embodiments.

It will be understood by those of ordinary skill in the art that various changes in form and details may be made therein without departing from the spirit and scope of the present invention as defined by the claims.

What is claimed is:

1. A method of manufacturing a semiconductor device comprising:
   in a silicon substrate of a semiconductor chip,
      providing two TSVs (Through-Silicon-Vias), the two TSVs being formed such that interfaces with the silicon substrate are covered with insulating films and bottom surface sides thereof do not penetrate through the silicon substrate;
   providing a high concentration impurity region in a peripheral region of the bottom surface sides of the two TSVs in the silicon substrate, wherein the high concentration impurity region is buried inside the silicon substrate so that the high concentration impurity region does not reach any surface of the silicon substrate, wherein the high concentration impurity region is separated from the two TSVs by the insulating films;
   connecting a test circuit to the two TSVs;
   inputting a test signal from one of the two TSVs and detecting an output of the test signal via the high concentration impurity region and the other of the two TSVs, thereby evaluating a failure of the semiconductor chip;
   thinning a bottom surface of the semiconductor chip and removing the high concentration impurity region; and
   laminating the semiconductor chip after the thinning.

2. A method of testing a semiconductor device comprising:
   in a silicon substrate of a semiconductor chip,
   providing two TSVs (Through-Silicon-Vias), the two TSVs being formed such that interfaces with the silicon substrate are covered with insulating films and bottom surface sides thereof do not penetrate through the silicon substrate;
   providing a high concentration impurity region in a peripheral region of the bottom surface sides of the two TSVs in the silicon substrate, wherein the high concentration impurity region is buried inside the silicon substrate so that the high concentration impurity region does not reach any surface of the silicon substrate, wherein the high concentration impurity region is separated from the two TSVs by the insulating films;
   connecting a test circuit to the two TSVs; and
   inputting a test signal from one of the two TSVs and detecting an output of the test signal via the high concentration impurity region and the other of the two TSVs, thereby evaluating a failure of the semiconductor chip.

* * * * *